United States Patent
Masaki et al.

(10) Patent No.: US 6,204,486 B1
(45) Date of Patent: Mar. 20, 2001

(54) HEATER UNIT FOR SEMICONDUCTOR PROCESSING

(75) Inventors: Takashi Masaki; Jun Futakuchiya; Kenzo Yasuda; Hidenori Ishiwata; Shinji Saito; Shinya Miyaji, all of Kanagawa-ken; Tsutomu Amakawa; Toshihiro Sugisawa, both of Tokyo, all of (JP)

(73) Assignees: NHK Spring Co., Ltd.; Taiyo Electric Heater Co., Ltd., both of (JP)

( * ) Notice: Subject to any disclaimer, the term of this patent is extended or adjusted under 35 U.S.C. 154(b) by 0 days.

(21) Appl. No.: 09/430,516

(22) Filed: Oct. 29, 1999

(30) Foreign Application Priority Data

Nov. 18, 1998 (JP) .................................................. 10-328140

(51) Int. Cl.$^7$ ...................................................... H05B 3/68
(52) U.S. Cl. ........................................ 219/444.1; 219/544
(58) Field of Search .............................. 219/468.1, 468.2, 219/536, 544, 546; 338/226, 228, 230, 243, 248, 249, 252, 253

(56) References Cited

U.S. PATENT DOCUMENTS

| | | | |
|---|---|---|---|
| 2,359,983 | * 10/1944 | Fry | 219/468.1 |
| 3,110,795 | * 11/1963 | Bremer | 219/468.1 |
| 3,436,816 | * 4/1969 | Lemelson | 219/468.1 |

* cited by examiner

Primary Examiner—Sang Paik
(74) Attorney, Agent, or Firm—Marger Johnson & McCollom, P.C.

(57) ABSTRACT

In a heater unit, comprising a lower metallic base, an upper metallic base placed closely over an upper surface of said lower base, and a resistance heater wire received in a groove defined between opposing surfaces of said lower and upper bases, ceramic powder is filled in said groove to keep said heater wire at least away from a wall surface of said groove. Thus, the heater wire can be directly installed in the groove of the base without the intervention of a sheath pipe so that the heater wire can be bent in a desired dense pattern, and the heater unit can be heated both rapidly and uniformly. Also, the ceramic powder filled in the groove improves the heat transfer, and this even further enhances the these advantages of the present invention.

16 Claims, 5 Drawing Sheets

HEATER UNIT FOR SEMICONDUCTOR PROCESSING

TECHNICAL FIELD

The present invention relates to a heater unit for semiconductor processing, and in particular to a heater unit having a resistance heating element embedded in a metallic base.

BACKGROUND OF THE INVENTION

Conventionally, heater units having a resistance heating element embedded in a metallic base have been widely used in susceptors and electrostatic chucks for semiconductor processing. The resistance heating element typically consists of a sheath heater including a sheath tube made of stainless steel. Typically, a stainless steel sheath heater is cast into an aluminum base, clamped between a pair of aluminum or stainless plates, or interposed between a pair of plates which are joined together by welding along the outer edge.

FIG. 7 shows a conventional cast heater unit 10 including a base 11 having a stainless steel sheath heater 12 cast therein. The stainless steel sheath heater 12 typically comprises a stainless steel sheath pipe, a resistance heater wire received in the sheath pipe, and an insulator which electrically insulates the resistance heater wire from the sheath pipe. The sheath heater 12 is bent into a desired shape, and is cast into the aluminum base 11. The aluminum base 11 is then machined and polished to a desired finish.

FIG. 8 shows a conventional clamped heater unit 13. In this case, the metallic base consists of a lower base 14 and an upper base 15, each made of an aluminum or stainless steel plate. A sheath heater 12 is received in a groove 14a formed in the lower base 14, and the upper base 15 is placed closely over the lower base 14. The upper and lower bases 14 and 15 are then firmly joined with each other by fastening them together with threaded bolts.

FIG. 9 shows a conventional welded heater unit 16. In this case also, the metallic base consists of a lower base 17 and an upper base 18, each made of an aluminum or stainless steel plate. Likewise, a sheath heater 12 is placed in a groove 17a formed in the lower base 17, and the upper base 18 is placed closely over the lower base 17. The upper and lower bases 17 and 18 are then firmly joined with each other by welding them together along their edges 19.

Each of the above described conventional arrangements uses a sheath heater which is bent into a meandering shape, and embedded in the base. It is desirable to sharply bend the sheath heater so that the sheath heater may extend uniformly in a fine pitch to the end of rapidly and uniformly heating the base. However, there is some difficulty in bending the sheath heater at sharp angles without causing excessive stress to the sheath heater.

Also, in the case of the cast heater unit, the metallic base typically consists of aluminum which has a relatively low melting point (typically about 540° C.), and the cast heater unit using such a metallic base is therefore unsuitable for use in a high temperature environment exceeding 500° C. in temperature. Also, because the sheath tube is typically made of stainless steel which has a substantially different thermal expansion coefficient from that of aluminum, the resulting thermal stress may cause deformation at high temperatures, and repeated applications of such a thermal stress may cause a breaking of the heater wire and/or a deformation of the heater unit.

In the case of the clamped heater unit, a certain gap is created between the upper and lower bases and/or between the sheath heater and the base, and this gap impairs heat transfer. It may prevent a highly responsive temperature control, and may cause localized temperature rises. Localized temperature rises are known to impair the durability of the resistance heater wire.

A welded heater unit is not much different from a clamped heater unit in these respects, and has the additional problem of distortion due to the heat at the time of welding.

BRIEF SUMMARY OF THE INVENTION

In view of such problems of the prior art, a primary object of the present invention is to provide a heater unit for semiconductor processing which is capable of quickly raising temperature, and heating uniformly.

A second object of the present invention is to provide a heater unit for semiconductor processing which allows a selection of materials from a wide range, and can be therefore adapted for use in high temperature environments.

A third object of the present invention is to provide a heater unit for semiconductor processing which is durable in use.

A fourth object of the present invention is to provide a heater unit for semiconductor processing which is suited for highly responsive temperature control.

According to the present invention, these and other objects can be accomplished by providing a heater unit, comprising; a lower metallic base; an upper metallic base placed closely over an upper surface of the lower base; and a resistance heater wire received in a groove defined between opposing surfaces of the lower and upper bases; wherein ceramic powder or other electrically insulating powder is filled in the groove to keep the heater wire at least away from a wall surface of the groove.

Because the heater wire can be directly installed in the groove of the base without the intervention of a sheath pipe, it is possible to bend the heater wire in a desired dense pattern so that the heater unit can be heated both rapidly and uniformly. Also, the electrically insulating powder filled in the groove improves the heat transfer, and this even further enhances the above mentioned advantages of the present invention.

To facilitate the placement of the heater wire in the groove, and prevent the heater wire from touching the base which is made of metallic material, spacers may be provided at a plurality of locations along the length of the heater wire for electrically insulating the heater wire from an adjacent surface of the upper and lower bases. The spacers may each consist of an annular member through which the heater wire is passed. The spacer preferably consists of ceramic or other materials which can withstand high temperatures without losing their required mechanical properties.

The upper and lower metallic bases are joined with each other most preferably by a bonding method selected from a group consisting of brazing, soldering and diffusion bonding. But, they may also be joined with each other by clamping, welding or any other known methods.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
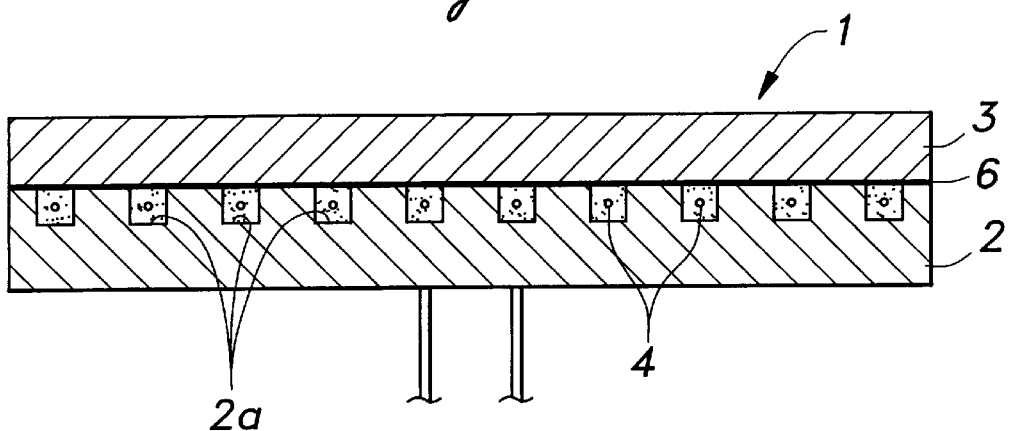
FIG. 1 is a sectional view showing the structure of a bonded heater unit embodying the present invention.
Figure 2:
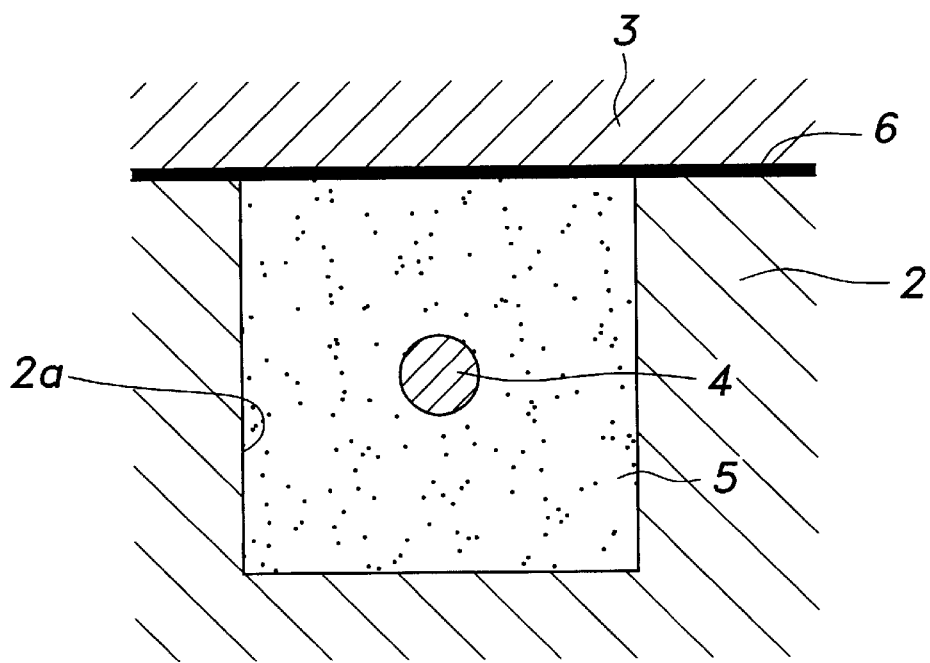
FIG. 2 is an enlarged sectional view of the groove for receiving the heater wire shown in FIG. 1.
Figure 3:
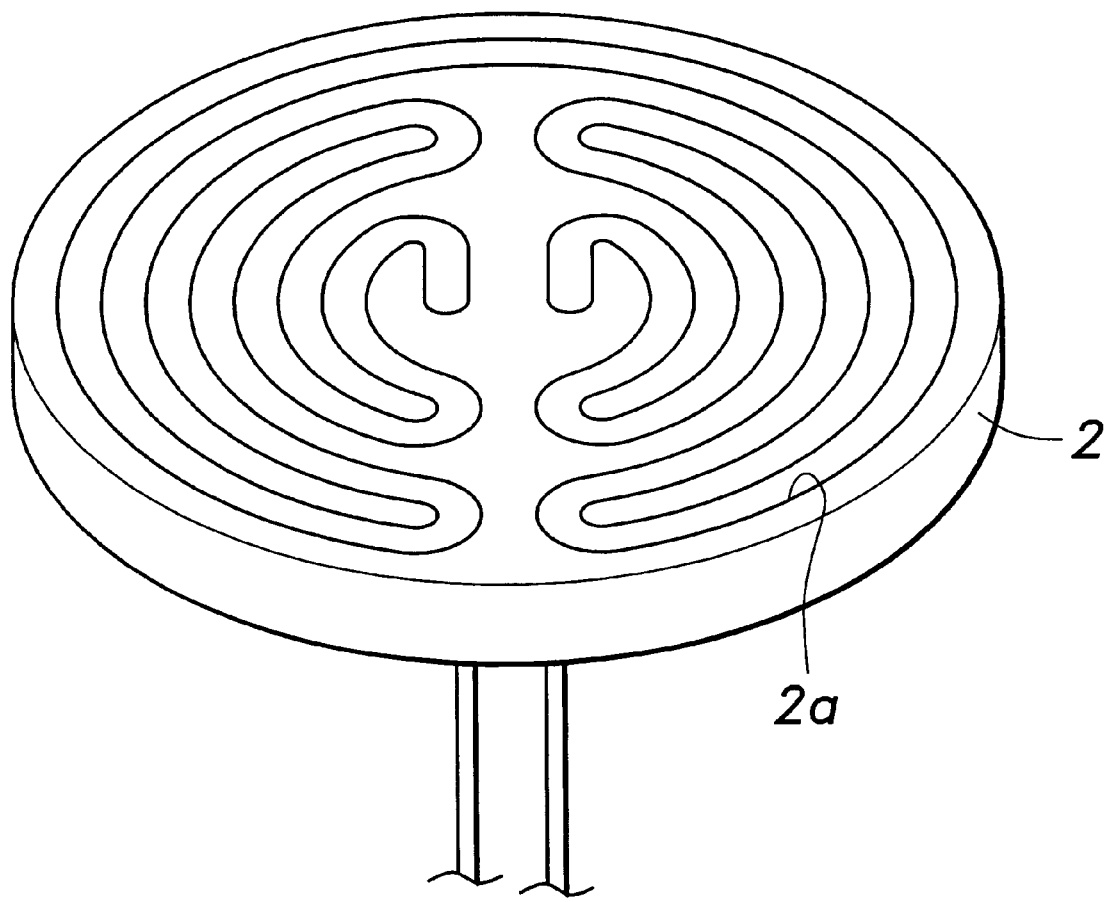
FIG. 3 is a view similar to FIG. 1 showing a second embodiment of the present invention.

In FIGS. 1 to 3 is shown a heater unit embodying the present invention which is suitable for use in CVD chambers and other situations in semiconductor manufacturing processes. This heater unit 1 comprises a base consisting of a lower base 2 and an upper base 3 placed over the lower base 2. The lower base 2 may be made of, preferably but not exclusively, aluminum, Al—Mg aluminum alloy, Al—Si—Mg aluminum alloy, stainless steel, titanium or titanium alloy. The upper base 3 may be similarly selected, but may be made of either a same material or a material different from that of the lower base 2. The lower base 2 is provided with a groove 2a on a surface thereof facing the upper base 3 to receive nichrome wire 4 serving as a resistance heater element. The groove 2a extends along a meandering path so that the base may be heated both uniformly and rapidly. The upper and lower bases are mutually and integrally bonded along the interfaces denoted by numeral 6 to one another by brazing, soldering or diffusion bonding.

Referring to FIG. 2, the nichrome wire 4 is placed centrally in the groove 2a which is filled with ceramic magnesia (MgO) powder 5. The nichrome wire 4 is thus mechanically supported in the groove 2a, and is electrically insulated from the surrounding walls of the groove 2a and the opposing surface of the upper base 3.

This can be accomplished as follows. The magnesia powder 5 is mixed with a solvent so as to form a paste which is initially coated over the inner wall surfaces of the groove 2a. The nichrome wire 4 can then be placed in the groove 2a in a spaced relationship to the inner wall surface of the groove 2a. The magnesia powder 5 is thereafter added into the groove 2a until the groove 2a is completely filled with the magnesia powder 5. Thus, the heater element can be arranged in a desired pitch and at a desired density insofar as the nichrome wire 4 can be bent. As can be readily appreciated, the nichrome wire 4 has a relatively small diameter, and can be substantially more sharply bent than the stainless tube for the sheath heater without causing any excessive stress in the nichrome wire 4.

Because the magnesia powder 5 allows favorable heat conduction between the nichrome wire 4 and the base, and between the upper and lower bases 2 and 3, the base can be heated both rapidly and uniformly. Also, the magnesia powder 5 favorably accommodates the thermal deformation of the nichrome wire 4 without creating any localized stress. Furthermore, the bonding of the upper and lower bases by brazing, soldering or diffusion bonding ensures a favorable heater transfer between them as compared to the more conventional cast, clamped and welded heater units although the primary advantages of the present invention can be obtained when the present invention is applied to cast, clamped and welded heater units.

When the base is made of stainless steel, the heater unit can be made suitable for high temperature applications. When the base is made of titanium or titanium alloy, not only the heater unit is made suitable for high temperature applications but also the weight of the heater unit can be significantly reduced.

Figure 4:
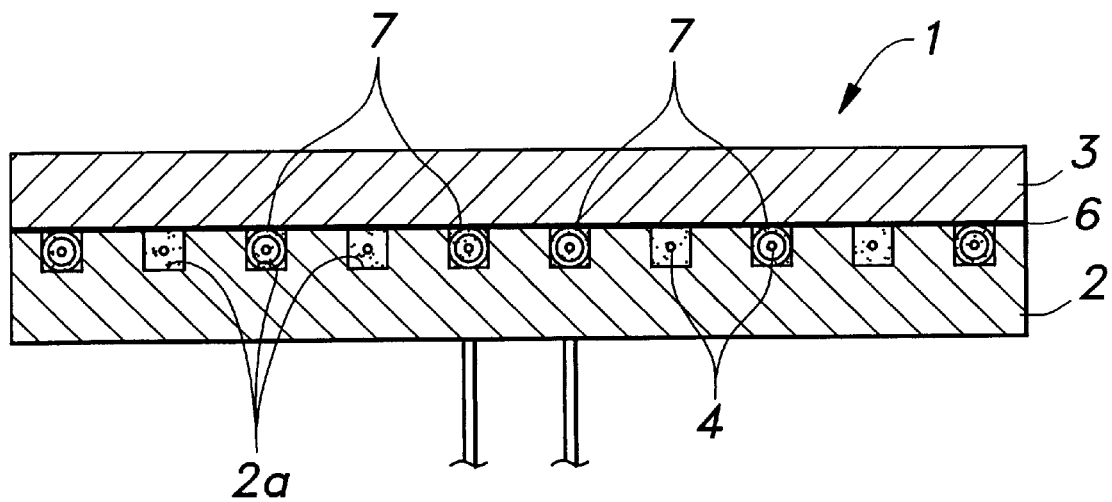
FIG. 4 is a view similar to FIG. 2 showing the second embodiment of the present invention.
Figure 5:
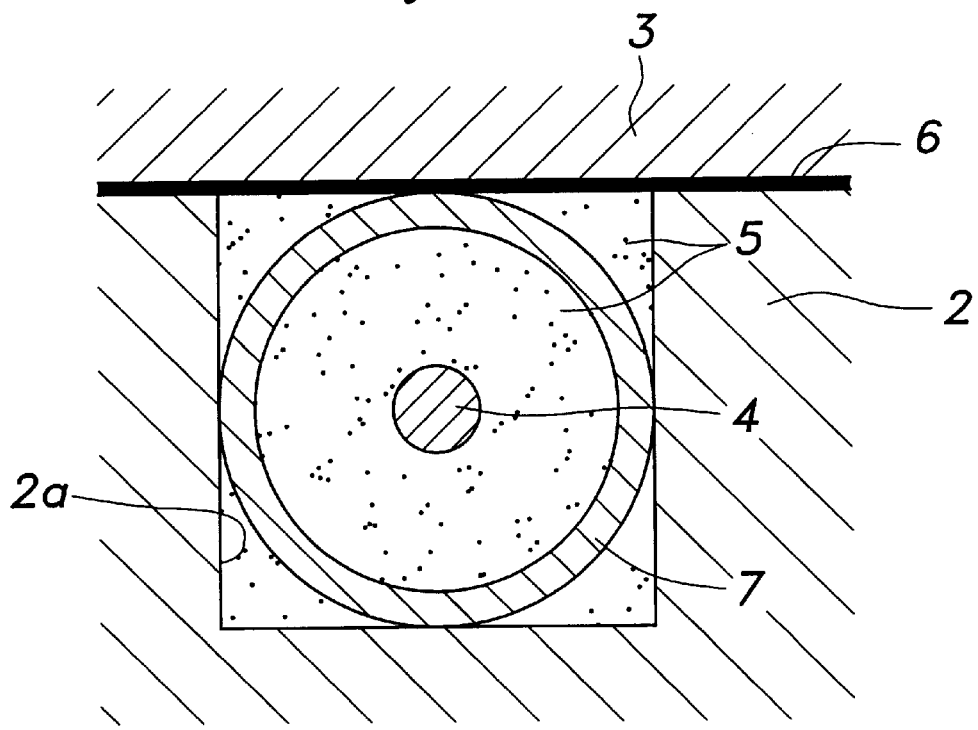
FIG. 5 is a view similar to FIG. 3 showing the second embodiment of the present invention.
Figure 6:
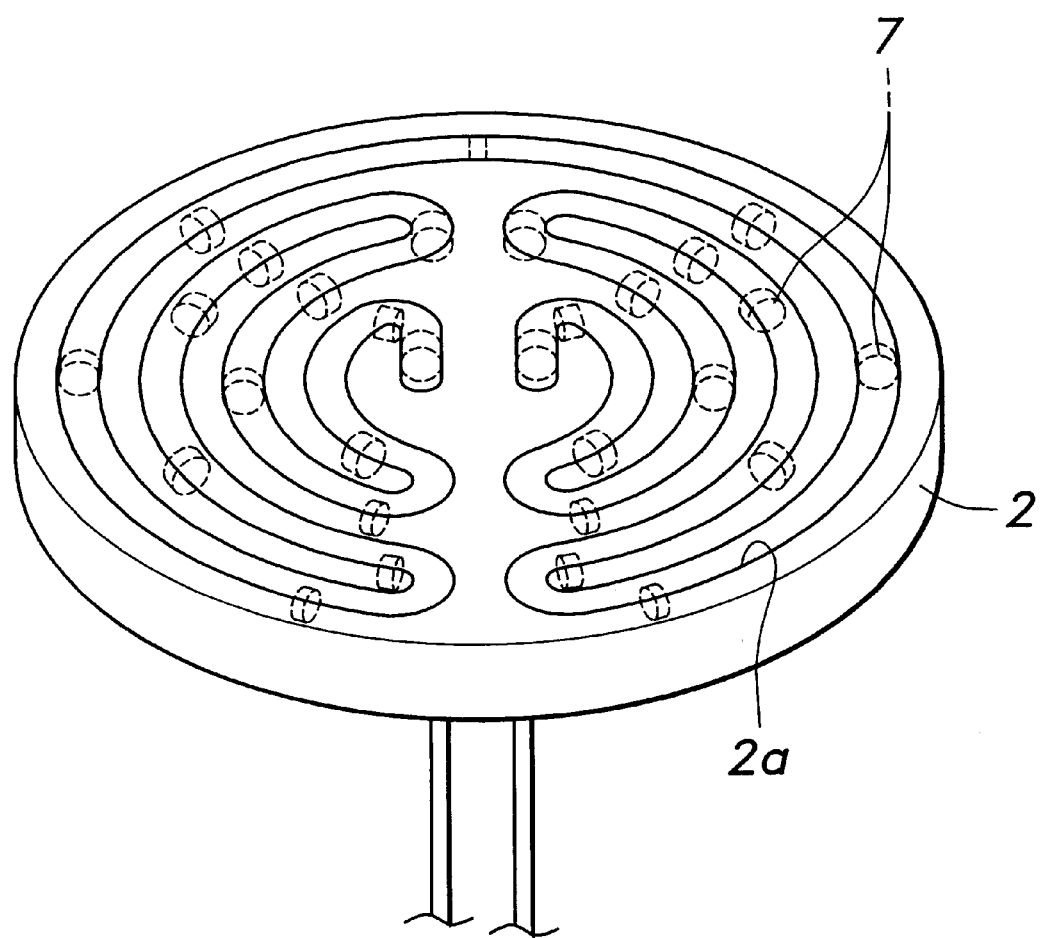
FIG. 6 is a sectional view of a conventional cast heater unit.
Figure 7:
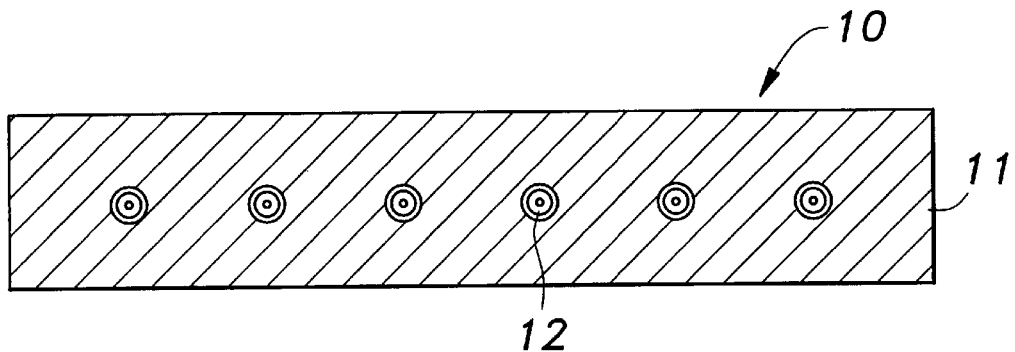
FIG. 7 is a sectional view of a conventional clamped heater unit.
Figure 8:
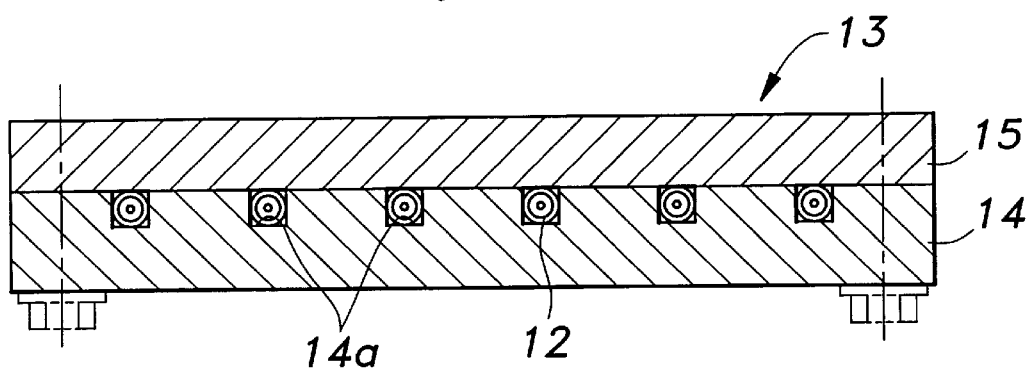
FIG. 8 is a sectional view of a conventional welded heater unit.
Figure 9:
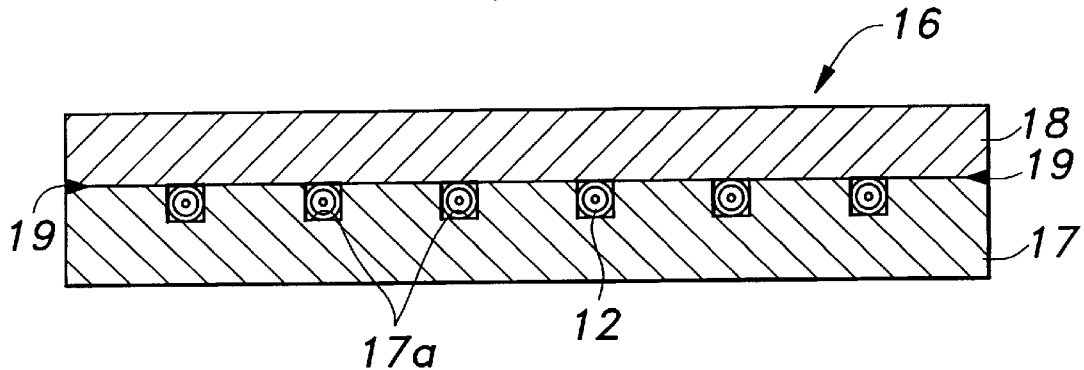
FIG. 9 is a sectional view of a conventional welded heater unit.

FIGS. 4 to 6 show a second embodiment of the present invention. In these drawings, the parts corresponding to those of the previous embodiments are denoted with like numerals. This embodiment is different from the previous embodiment only in that the nichrome wire 4 is passed through a plurality of annular spacers 7 which are, for instance, made of ceramic magnesia (MgO) in the groove 2a. The remaining space in the groove 2a is filled with magnesia powder. The number and arrangement of these spacers 7 may be selected so that the nichrome wire 4 may be kept out of contact from the lower and upper bases 2 and 3.

By using such spacers, there is no need to deposit magnesia powder in the groove 2a before installing the nichrome wire 4, and the filling of the groove 2a with the magnesia powder can be accomplished in a single step. Therefore, this embodiment provides an improved efficiency in the assembling process, but is otherwise similar to the first embodiment.

As can be appreciated from the above description, because the heater wire can be directly installed in the groove of the base without the intervention of a sheath pipe, it is possible to bend the heater wire in a desired dense pattern so that the heater unit can be heated both rapidly and uniformly. Also, the ceramic powder filled in the groove improves the heat transfer, and this even further enhances the above mentioned advantages of the present invention.

Although the present invention has been described in terms of preferred embodiments thereof, it is obvious to a person skilled in the art that various alterations and modifications are possible without departing from the scope of the present invention which is set forth in the appended claims.

What is claimed is:

1. A heater unit, comprising:
    a lower metallic base;
    an upper metallic base placed closely over an upper surface of said lower base; and
    a resistance heater wire received in a groove defined between opposing surfaces of said lower and upper bases;
    electrically insulating powder being filled in said groove to keep said heater wire at least away from a wall surface of said groove while accommodating thermal deformation of the wire.

2. A heater unit according to claim 1, wherein said electrically insulating powder comprises ceramic powder.

3. A heater unit according to claim 1, further comprising spacers provided at a plurality of locations along the length of said heater wire for electrically insulating said heater wire from an adjacent surface of said upper and lower bases.

4. A heater unit according to claim 3, wherein each of said spacers consists of an annular member through which said heater wire is passed.

5. A heater unit according to claim 3, wherein each of said spacers is made of ceramic material.

6. A heater unit according to claim 1, wherein said groove is formed only in said lower metallic base.

7. A heater unit according to claim 1, wherein said upper and lower bases each consist of a material selected from a group consisting of aluminum, Al—Mg aluminum alloy, Al—Si—Mg aluminum alloy, stainless steel, titanium and titanium alloy.

8. A heater unit according to claim 1, wherein said upper and lower metallic bases are joined with each other by a bonding method selected from a group consisting of brazing, soldering and diffusion bonding.

9. A heater unit according to claim 1, wherein said upper and lower metallic bases are joined with each other by clamping.

10. A heater unit according to claim 1, wherein said upper and lower metallic bases are joined with each other by welding.

11. The heater unit according to claim 1, wherein said groove is filled with the electrically insulating powder in such a manner that allows the heater wire to be bent in a predetermined pattern therein.

12. The heater unit according to claim 1, wherein the insulating powder is ceramic magnesium oxide powder.

13. A heater unit, comprising:

a lower metallic base;

an upper metallic base placed closely over an upper surface of said lower base;

a resistance heater wire received in a groove defined between opposing surfaces of said lower and upper bases; and spacers provided at a plurality of locations along the length of said heater wire for electrically insulating said heater wire from an adjacent surface of said upper and lower bases, wherein electrically insulating powder is filled in said groove to keep said heater wire at least away from a wall surface of said groove.

14. The heater unit according to claim 13, wherein each of said spacers consists of an annular member through which said heater wire is passed.

15. The heater unit according to claim 13, wherein each of said spacers is made of a ceramic material.

16. The heater unit according to claim 13, wherein the insulating powder is ceramic magnesium oxide powder.

\* \* \* \* \*

UNITED STATES PATENT AND TRADEMARK OFFICE
CERTIFICATE OF CORRECTION

PATENT NO.   : 6,204,486 B1
DATED        : March 20, 2001
INVENTOR(S)  : Masaki et al.

It is certified that error appears in the above-identified patent and that said Letters Patent is hereby corrected as shown below:

Title page,
Item [57], ABSTRACT,
Lines 12-13, "the these advantages" should read -- the advantages --.

Column 2,
Line 28, "comprising;" should read -- comprising: --.

Column 3,
Line 10, "unit; and" should read -- unit; --.
Line 13, "unit." should read -- unit; and --.

Signed and Sealed this

Twenty-seventh Day of August, 2002

*Attest:*

JAMES E. ROGAN
*Attesting Officer*   *Director of the United States Patent and Trademark Office*